(12) United States Patent
Haugli

(10) Patent No.: US 7,230,735 B2
(45) Date of Patent: Jun. 12, 2007

(54) FORWARD LINK TEXT COMPRESSION IN SATELLITE MESSAGING

(75) Inventor: Hans Haugli, Ottawa (CA)

(73) Assignee: TransCore Link Logistics Corp., Nova Scotia (CA)

( * ) Notice: Subject to any disclaimer, the term of this patent is extended or adjusted under 35 U.S.C. 154(b) by 1109 days.

(21) Appl. No.: 10/197,818

(22) Filed: Jul. 19, 2002

(65) Prior Publication Data

US 2003/0164781 A1  Sep. 4, 2003

Related U.S. Application Data

(60) Provisional application No. 60/306,165, filed on Jul. 19, 2001.

(51) Int. Cl.
  *G06F 3/12* (2006.01)
  *H04N 1/32* (2006.01)

(52) U.S. Cl. .................. 358/1.15; 358/426.03

(58) Field of Classification Search .......... 358/1.15, 358/1.9, 1.11, 1.14, 1.18, 401, 403, 405, 426.02, 358/426.03, 426.04, 426.07, 426.11, 426.12, 358/426.13, 426.14, 426.15, 426.16
See application file for complete search history.

(56) References Cited

U.S. PATENT DOCUMENTS

| | | | |
|---|---|---|---|
| 4,420,771 A | 12/1983 | Pirsch | 358/261 |
| 4,813,056 A | 3/1989 | Fedele | 375/27 |
| 5,652,583 A | 7/1997 | Kang | 341/67 |
| 5,838,963 A * | 11/1998 | Griffiths | 707/6 |
| 6,292,115 B1 * | 9/2001 | Heath | 341/87 |

FOREIGN PATENT DOCUMENTS

EP  0 685 970 A2  12/1985

OTHER PUBLICATIONS

"A modified huffman procedure with reduced memory requirement", M. Hankamer, IEEE Transactions on Communications, vol. COM-27, No. 6, 1979, pp. 930-932.
Digital cellular telecommunications system (phase 2+ ) (GSM); universal mobile telecommunications systems (UMTS); compression algorithm for text messaging services (3GPP TS 23.042 version 4.0.0. Release 4), ETSI TS 123 042, Mar. 2001, pp. 1-76.

* cited by examiner

*Primary Examiner*—Douglas Q. Tran
(74) *Attorney, Agent, or Firm*—Blank Rome LLP

(57) ABSTRACT

A method of transmitting communication information employing a coding scheme being defined by a character set. The characters of the character set are encoded into codewords of a sequence of bits, the codewords being of varying length. The characters are divided into at least two categories. The categories may be a first category of shifted characters and a second category of unshifted characters. Where a shifted character is encountered during encoding a shift codeword is inserted in the sequence of bits. This allows each category to use overlapping codewords. Then the sequence is converted to ASCII characters to be transmitted.

25 Claims, 3 Drawing Sheets

FORWARD LINK TEXT COMPRESSION IN SATELLITE MESSAGING

CROSS-REFERENCE TO RELATED APPLICATION

This application claims the benefit of U.S. Provisional Application No. 60/306,165 filed Jul. 19, 2001, incorporated by reference herein.

FIELD OF THE INVENTION

This invention relates to the field of satellite communications, and in particular to a satellite messaging system operative to provide communications between a mobile terminal and a fixed ground station having forward link text compression.

BACKGROUND OF THE INVENTION

Satellites in a geosynchronous orbit, located approximately 22,000 miles above the equator, may be used to provide one-way or two-way communications with a widely dispersed remote terminal population, some of which may be affixed to mobile assets. Communications transmissions from a central hub via satellite to the remote terminals are referred to as the forward link, while communications transmissions from the remote terminals via satellite to a central hub are referred to as the return link.

The amount of data that can be transmitted through a communication channel is limited by the bandwidth of the channel. Therefore, data compression methods and systems are useful for storing and transmitting large quantities of data. The more data is compressed, the greater the quantity of data can be transmitted over a communication channel. For example, the time required to transmit data is reduced when compression is used to decrease the number of bits of data to be transmitted, especially on communication channels with narrow bandwidth. Accordingly, data compression systems aim to effect savings in memory required to store the data or the amount of time (bandwidth) required to transmit the data. By decreasing the required memory for data storage or the required time for data transmission, compression results in monetary savings.

Data compression methods that compress data signals and decompress the compressed data signals back into the original data are known. For example, a conventional text data compression method is the Huffman Coding technique. In the Huffman Coding data compression technique, frequently used characters are assigned smaller codes than characters that are less frequently used. Since it is not possible to determine when one codeword ends and another starts, no complete code for any character can be the beginning of the code for another character. This leads to some quite long codewords for low probability characters. The Huffman method typically results in long coding sequences and is not suitable for satellite communication.

SUMMARY OF THE INVENTION

A text compression technique based on an enhancement to conventional Huffman character encoding described above is disclosed. The improvement to the conventional Huffman encoding is selected and defined based on the use of an additional shift character to denote a change from letters to other symbols on the keyboard, or vice versa. A conventional variable length Huffman code is utilized, with 2 modifications: a) code length is limited to 8 bits to simplify coding, and b) use of a shift character. This exploits the fact that letters and symbols are normally used in sequence depending on whether the data is primarily textual or numeric. The result is the duplicated use of the same set of codewords by both letters and other symbols, permitting a substantial improvement in compression and a limit on the length of codewords for low probability characters.

The invention finds use in a variety of communication applications. In particular, the invention is very useful with the wireless packet data distributed communications system disclosed in U.S. Pat. No. 5,991,279 assigned to Vistar Telecommunications Inc. The average number of codeword bits is reduced to 4.3, a saving of approximately 40% relative to conventional Huffman encoding. The system can deliver 38 byte messages in the forward (to mobile) link and 11 byte messages (up to 20 characters) in the return link (from mobile). For technical reasons, it is advantageously for, each complete message on the return link only to require one packet. Whereas, using Huffman coding, it is only possible to send about 11 characters per packet, the encoding scheme of the present invention can increase this number to 20. When coupled with a forms application at the receiving terminal, wherein received data is inserted into fields of forms containing fixed data stored at the receiver, the increase in per-packet capacity leads to considerable system enhancement.

In an advantageous embodiment, the text compression method of the present invention limits the character set to 57 characters. The maximum wordlength is 8 bits, and a short (4 bit) shift character is used to switch between letters and numbers/special characters.

Thus, according to one aspect, the invention provides method of transmitting communication information employing a coding scheme being defined by a character set. The method comprises the steps of dividing the character set into subsets; encoding the characters in each subset with codewords of varying length dependent on the probability of occurrence of the encoded character, the subsets employing overlapping codewords, and each codeword within each said subset comprising a unique sequence of bits; and transmitting a unique indicator to identify a said subset to which transmitted characters belong.

According to another aspect, the invention provides method of compressing a character set of text data including characters. The method comprises the steps of dividing the character set into subsets; encoding the characters in each subset with codewords of varying length dependent on the probability of occurrence of the encoded character, the subsets employing overlapping codewords, and each codeword within each said subset comprising a unique sequence of bits; and inserting a unique indicator in the compressed data to identify the subset to which said encoded characters belong.

In another aspect, the invention provides, in a data communications system for transmitting textual data between one or more remote terminals and an Earth station via a satellite, a method of transmitting data on an uplink signal employing a coding scheme being defined by a character set, comprising the steps of dividing the character set into subsets; encoding the characters in each subset with codewords of varying length dependent on the probability of occurrence of the encoded character, said subsets employing overlapping codewords, and each codeword within each said subset comprising a unique sequence of bits; and transmitting a unique indicator to identify a said subset to which transmitted characters belong.

In a still further aspect the invention provides an apparatus for compressing textual data defined by characters forming part of a character set, wherein the characters are encoded by binary codewords of variable length, comprising an input device for receiving said characters; an output device for outputting compressed data; and a processor for encoding the characters in each subset with codewords of varying length dependent on the probability of occurrence of the encoded character, said subsets employing overlapping codewords, each codeword within each said subset comprising a unique sequence of bits, and inserting a unique indicator in the compressed data to identify the subset to which said encoded characters belong.

Other aspects and advantages of embodiments of the invention will be readily apparent to those ordinarily skilled in the art upon a review of the following description.

BRIEF DESCRIPTION OF THE DRAWINGS

Embodiments of the invention will now be described in conjunction with the accompanying drawings, wherein:

FIG. 1 illustrates a basic communication system that the present invention may be used with;

This invention will now be described in detail with respect to certain specific representative embodiments thereof, the materials, apparatus and process steps being understood as examples that are intended to be illustrative only. In particular, the invention is not intended to be limited to the methods, materials, conditions, process parameters, apparatus and the like specifically recited herein.

DETAILED DESCRIPTION OF THE PREFERRED EMBODIMENTS

Figure 1:
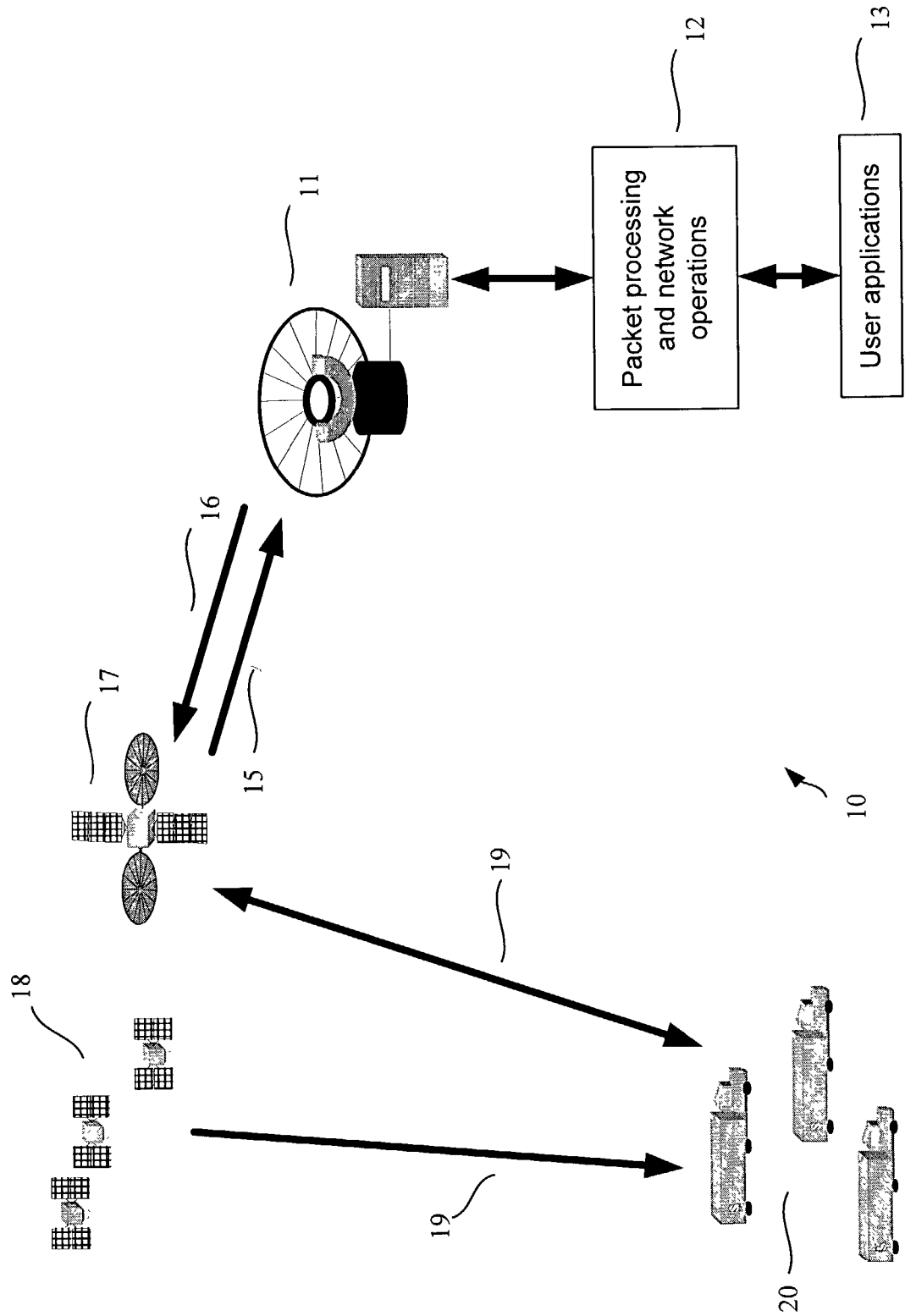

The present invention comprises a data compression system for compressing forward link data signals for transmittal from a first computer to a second computer, and decompressing the compressed code signals and restoring the original data when received by the second computer. The present invention may be used in conjunction with a variety of communication systems, an exemplary embodiment of such a system is illustrated in FIG. 1. In this embodiment, the satellite communications system 10 consists of a central Earth station 11 which is connected to packet processing and network operations 12, which in turn communicates with various user applications 13.

The Earth station 11 is also coupled by satellite links 15, 16 to a geostationary multi-beam satellite 17 and GPS constellations 18 which relays the signals via links 19 to and from a plurality of remote terminals 20, typically mounted on vehicles, such as helicopters, truck trailers, passenger cars, and rail cars. The satellite 18 permits coverage over a wide geographical area.

The satellite communications link 16, 19, which originates at the Earth station 11 and is relayed through a satellite 17, to the terminals 20, is referred to as the forward link. The satellite communications link 19, 15 which originates at the terminals 20 and is relayed through a satellite 17 to the Earth station 11, is referred to as the return link. Those skilled in the art will acknowledge that the key elements of the present invention pertain to mobile as well as fixed terminals, to satellites in non-geostationary orbits and to terrestrial communication systems.

In such systems, bandwidth in the communication channel between the Earth Station and the trucks is limited and costly, so compression of the textual data is employed. The data to be compressed in the forward link 16, 19 may comprise, for example, alphanumeric text and the like. The characters of the alphabet to be compressed are processed as bytes of binary digits in a convenient code. For the purposes of this description, it is assumed that a full complement of English letters needs to be transmitted, as well as 29 other characters or symbols.

A conventional variable length Huffman code is utilized, with 2 modifications: a) code length is limited to 8 bits to simplify coding, and b) use of a shift character.

A summary of the character codewords is given in Table 1. It can be seen that high probability characters such as the letter E uses short codewords. Seldom used characters such as Z use an 8 bit codeword.

The character set supports capital letters only, lower case letters are converted to upper case. Special characters not supported are replaced by a space.

TABLE 1

| Unshifted character | | | | | Shifted character | | |
|---|---|---|---|---|---|---|---|
| ASCII dec | ASCII hex | Character | Codeword | # bits | ASCII dec | ASCII hex | Character |
| 69 | 45 | E | 000 | 3 | 48 | 30 | 0 |
| 32 | 20 | Space | 110 | 3 | 32 | 20 | Space |
| 65 | 41 | A | 1001 | 4 | 50 | 32 | 2 |
| 73 | 49 | I | 0110 | 4 | 52 | 34 | 4 |
| 78 | 4E | N | 0101 | 4 | 53 | 35 | 5 |
| 79 | 4F | O | 0111 | 4 | 51 | 33 | 3 |
| 83 | 53 | S | 0010 | 4 | 54 | 36 | 6 |
| 84 | 54 | T | 1011 | 4 | 49 | 31 | 1 |
| NA | NA | Shift | 0011 | 4 | NA | NA | Un-shifted |
| 67 | 43 | C | 01000 | 5 | 36 | 24 | $ |
| 68 | 44 | D | 10100 | 5 | 57 | 39 | 9 |
| 72 | 48 | H | 11111 | 5 | 55 | 37 | 7 |
| 76 | 4C | L | 10001 | 5 | 35 | 23 | # |
| 82 | 52 | R | 11110 | 5 | 56 | 38 | 8 |
| 70 | 46 | F | 101011 | 6 | 58 | 3A | : |
| 71 | 47 | G | 100001 | 6 | 60 | 3C | < |
| 77 | 4D | M | 111001 | 6 | 44 | 2C | , |
| 80 | 50 | P | 010011 | 6 | 33 | 21 | ! |
| 85 | 55 | U | 111011 | 6 | 46 | 2E | . |

TABLE 1-continued

| Unshifted character | | | | | Shifted character | | |
| --- | --- | --- | --- | --- | --- | --- | --- |
| ASCII dec | ASCII hex | Character | Codeword | # bits | ASCII dec | ASCII hex | Character |
| 87 | 57 | W | 111000 | 6 | 47 | 2F | / |
| 89 | 59 | Y | 100000 | 6 | 62 | 3E | > |
| 66 | 42 | B | 1110101 | 7 | 43 | 2B | + |
| 86 | 56 | V | 0100101 | 7 | 61 | 3D | = |
| 63 | 3F | ? | 0100100 | 7 | 45 | 2D | - |
| 74 | 4A | J | 11101000 | 8 | 41 | 29 | ) |
| 75 | 4B | K | 11101001 | 8 | 40 | 28 | ( |
| 81 | 51 | Q | 10101001 | 8 | 64 | 40 | @ |
| 88 | 58 | X | 10101000 | 8 | 38 | 26 | & |
| 90 | 5A | Z | 10101011 | 8 | 37 | 25 | % |
| 39 | 27 | ' | 10101010 | 8 | 7 | 07 | Control G |

The text compression and expansion naturally belong at the application levels at either end of the link.

Compression

Figure 2:
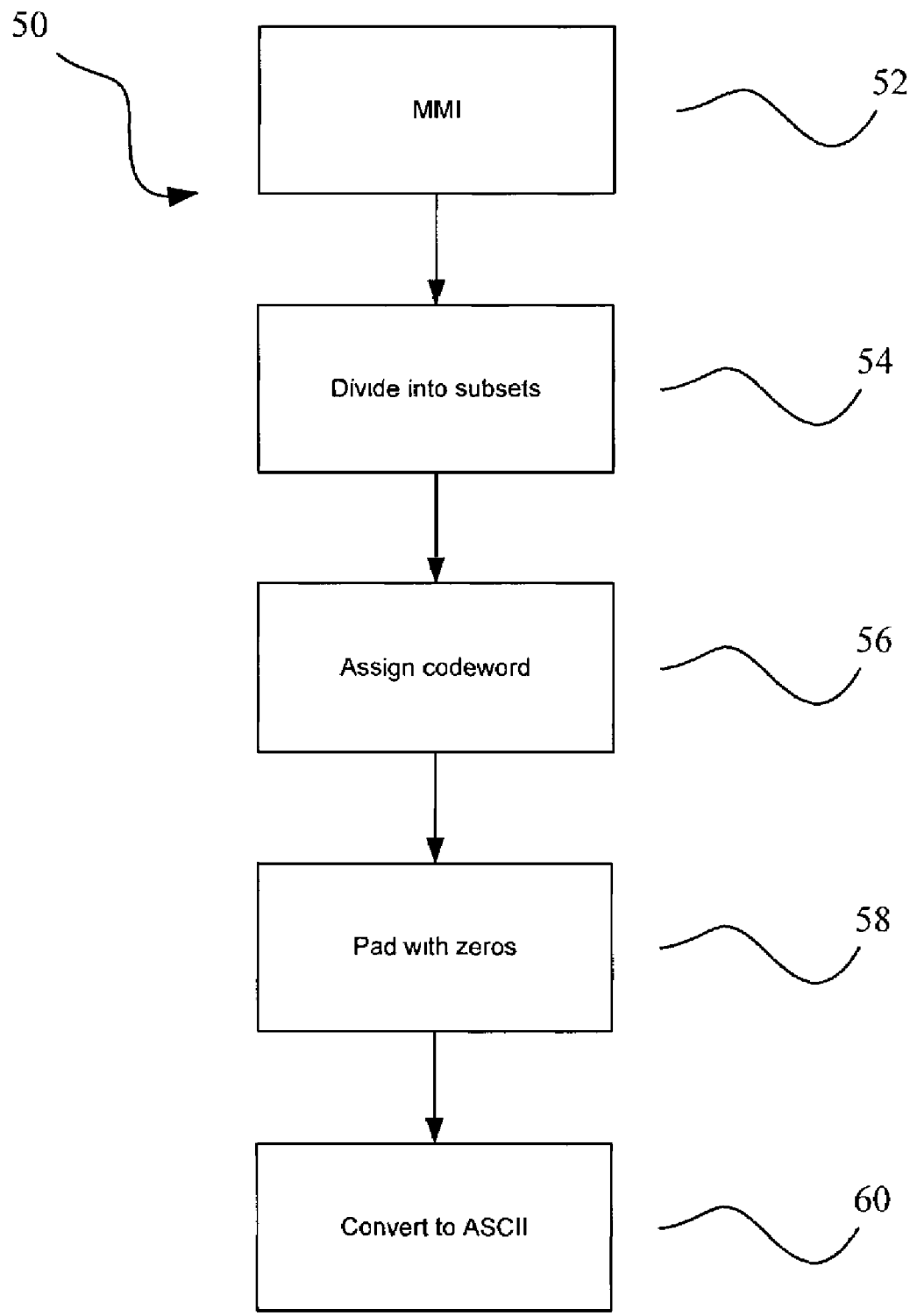
FIG. 2 illustrates a flowchart of the software used in accordance with the present invention.

FIG. 2 is a flowchart illustrating the method 50 of transmitting communication information (data) by employing a coding scheme for text compression. In step 52 the Man Machine Interface (MMI) provides an ASCII text string message. The starting shift state is unshifted (letters). In step 54, the characters are split into subsets defining categories, in this case shifted and unshifted character. If a character is encountered that requires a shift in character set, the shift codeword (0011) is inserted and the shift state flag changed. In step 56, every character in the string is replaced with its binary codeword (3 to 8 bits) and added to the compressed string. In step 58, this string is padded with 0s to ensure the length contains an integer number of bytes. In step 60, the compressed string is then converted to new 8 bit ASCII characters that are sent via the network.

Table 2 shows the ASCII to codeword translations. The start state is unshifted, and the shift codeword is 0011.

TABLE 2

| ASCII dec | ASCII hex | Character | Codeword | Length | Shifted |
| --- | --- | --- | --- | --- | --- |
| 0 | 00 | Null | 110 | 3 | N/Y |
| 1 | 01 | — | 110 | 3 | N/Y |
| 2 | 02 | — | 110 | 3 | N/Y |
| 3 | 03 | — | 110 | 3 | N/Y |
| 4 | 04 | — | 110 | 3 | N/Y |
| 5 | 05 | — | 110 | 3 | N/Y |
| 6 | 06 | — | 110 | 3 | N/Y |
| 7 | 07 | Control G | 10101010 | 8 | Y |
| 8 | 08 | — | 110 | 3 | N/Y |
| 9 | 09 | — | 110 | 3 | N/Y |
| 10 | 0A | — | 110 | 3 | N/Y |
| 11 | 0B | — | 110 | 3 | N/Y |
| 12 | 0C | — | 110 | 3 | N/Y |
| 13 | 0D | — | 110 | 3 | N/Y |
| 14 | 0E | — | 110 | 3 | N/Y |
| 15 | 0F | — | 110 | 3 | N/Y |
| 16 | 10 | — | 110 | 3 | N/Y |
| 17 | 11 | — | 110 | 3 | N/Y |
| 18 | 12 | — | 110 | 3 | N/Y |
| 19 | 13 | — | 110 | 3 | N/Y |
| 20 | 14 | — | 110 | 3 | N/Y |
| 21 | 15 | — | 110 | 3 | N/Y |
| 22 | 16 | — | 110 | 3 | N/Y |
| 23 | 17 | — | 110 | 3 | N/Y |
| 24 | 18 | — | 110 | 3 | N/Y |
| 25 | 19 | — | 110 | 3 | N/Y |
| 26 | 1A | — | 110 | 3 | N/Y |
| 27 | 1B | — | 110 | 3 | N/Y |
| 28 | 1C | " | 110 | 3 | N/Y |
| 29 | 1D | " | 110 | 3 | N/Y |

TABLE 2-continued

| ASCII dec | ASCII hex | Character | Codeword | Length | Shifted |
| --- | --- | --- | --- | --- | --- |
| 30 | 1E | — | 110 | 3 | N/Y |
| 31 | 1F | — | 110 | 3 | N/Y |
| 32 | 20 | Space | 110 | 3 | N/Y |
| 33 | 21 | ! | 010011 | 6 | Y |
| 34 | 22 | " | 110 | 3 | N/Y |
| 35 | 23 | # | 10001 | 5 | Y |
| 36 | 24 | $ | 01000 | 5 | Y |
| 37 | 25 | % | 10101011 | 8 | Y |
| 38 | 26 | & | 10101000 | 8 | Y |
| 39 | 27 | ' | 10101010 | 8 | N |
| 40 | 28 | ( | 11101001 | 8 | Y |
| 41 | 29 | ) | 11101000 | 8 | Y |
| 42 | 2A | * | 110 | 3 | N/Y |
| 43 | 2B | + | 1110101 | 7 | Y |
| 44 | 2C | , | 111001 | 6 | Y |
| 45 | 2D | - | 0100100 | 7 | Y |
| 46 | 2E | . | 111011 | 6 | Y |
| 47 | 2F | / | 111000 | 6 | Y |
| 48 | 30 | 0 | 000 | 3 | Y |
| 49 | 31 | 1 | 1011 | 4 | Y |
| 50 | 32 | 2 | 1001 | 4 | Y |
| 51 | 33 | 3 | 0111 | 4 | Y |
| 52 | 34 | 4 | 0110 | 4 | Y |
| 53 | 35 | 5 | 0101 | 4 | Y |
| 54 | 36 | 6 | 0010 | 4 | Y |
| 55 | 37 | 7 | 11111 | 5 | Y |
| 56 | 38 | 8 | 11110 | 5 | Y |
| 57 | 39 | 9 | 10100 | 5 | Y |
| 58 | 3A | : | 101011 | 6 | Y |
| 59 | 3B | ; | 110 | 3 | N/Y |
| 60 | 3C | < | 100001 | 6 | Y |
| 61 | 3D | = | 0100101 | 7 | Y |
| 62 | 3E | > | 100000 | 6 | Y |
| 63 | 3F | ? | 0100100 | 7 | N |
| 64 | 40 | @ | 10101001 | 8 | Y |
| 65 | 41 | A | 1001 | 4 | N |
| 66 | 42 | B | 1110101 | 7 | N |
| 67 | 43 | C | 01000 | 5 | N |
| 68 | 44 | D | 10100 | 5 | N |
| 69 | 45 | E | 000 | 3 | N |
| 70 | 46 | F | 101011 | 6 | N |
| 71 | 47 | G | 100001 | 6 | N |
| 72 | 48 | H | 11111 | 5 | N |
| 73 | 49 | I | 0110 | 4 | N |
| 74 | 4A | J | 11101000 | 8 | N |
| 75 | 4B | K | 11101001 | 8 | N |
| 76 | 4C | L | 10001 | 5 | N |
| 77 | 4D | M | 111001 | 6 | N |
| 78 | 4E | N | 0101 | 4 | N |
| 79 | 4F | O | 0111 | 4 | N |
| 80 | 50 | P | 010011 | 6 | N |
| 81 | 51 | Q | 10101001 | 8 | N |
| 82 | 52 | R | 11110 | 5 | N |
| 83 | 53 | S | 0010 | 4 | N |
| 84 | 54 | T | 1011 | 4 | N |

TABLE 2-continued

| ASCII dec | ASCII hex | Character | Codeword | Length | Shifted |
|---|---|---|---|---|---|
| 85 | 55 | U | 111011 | 6 | N |
| 86 | 56 | V | 0100101 | 7 | N |
| 87 | 57 | W | 111000 | 6 | N |
| 88 | 58 | X | 10101000 | 8 | N |
| 89 | 59 | Y | 100000 | 6 | N |
| 90 | 5A | Z | 10101011 | 8 | N |
| 91 | 5B | [ | 110 | 3 | N/Y |
| 92 | 5C | \ | 110 | 3 | N/Y |
| 93 | 5D | ] | 110 | 3 | N/Y |
| 94 | 5E | ^ | 110 | 3 | N/Y |
| 95 | 5F | _ | 110 | 3 | N/Y |
| 96 | 60 | ` | 110 | 3 | N/Y |
| 97 | 61 | a | 1001 | 4 | N |
| 98 | 62 | b | 1110101 | 7 | N |
| 99 | 63 | c | 01000 | 5 | N |
| 100 | 64 | d | 10100 | 5 | N |
| 101 | 65 | e | 000 | 3 | N |
| 102 | 66 | f | 101011 | 6 | N |
| 103 | 67 | g | 100001 | 6 | N |
| 104 | 68 | h | 11111 | 5 | N |
| 105 | 69 | i | 0110 | 4 | N |
| 106 | 6A | j | 11101000 | 8 | N |
| 107 | 6B | k | 11101001 | 8 | N |
| 108 | 6C | l | 10001 | 5 | N |
| 109 | 6D | m | 111001 | 6 | N |
| 110 | 6E | n | 0101 | 4 | N |
| 111 | 6F | o | 0111 | 4 | N |
| 112 | 70 | p | 010011 | 6 | N |
| 113 | 71 | q | 10101001 | 8 | N |
| 114 | 72 | r | 11110 | 5 | N |
| 115 | 73 | s | 0010 | 4 | N |
| 116 | 74 | t | 1011 | 4 | N |
| 117 | 75 | u | 111011 | 6 | N |
| 118 | 76 | v | 0100101 | 7 | N |
| 119 | 77 | w | 111000 | 6 | N |
| 120 | 78 | x | 10101000 | 8 | N |
| 121 | 79 | y | 100000 | 6 | N |
| 122 | 7A | z | 10101011 | 8 | N |
| 123 | 7B | { | 110 | 3 | N/Y |
| 124 | 7C | \| | 110 | 3 | N/Y |
| 125 | 7D | } | 110 | 3 | N/Y |
| 126 | 7E | ~ | 110 | 3 | N/Y |
| 127 | 7F |  | 110 | 3 | N/Y |
| 128 | 80 | € | 110 | 3 | N/Y |
| 129 | 81 | □ | 110 | 3 | N/Y |
| 130 | 82 | ‚ | 110 | 3 | N/Y |
| 131 | 83 | ƒ | 110 | 3 | N/Y |
| 132 | 84 | „ | 110 | 3 | N/Y |
| 133 | 85 | … | 110 | 3 | N/Y |
| 134 | 86 | † | 110 | 3 | N/Y |
| 135 | 87 | ‡ | 110 | 3 | N/Y |
| 136 | 88 | ˆ | 110 | 3 | N/Y |
| 137 | 89 | ‰ | 110 | 3 | N/Y |
| 138 | 8A | Š | 110 | 3 | N/Y |
| 139 | 8B | ‹ | 110 | 3 | N/Y |
| 140 | 8C | Œ | 110 | 3 | N/Y |
| 141 | 8D | □ | 110 | 3 | N/Y |
| 142 | 8E | Ž | 110 | 3 | N/Y |
| 143 | 8F | □ | 110 | 3 | N/Y |
| 144 | 90 | □ | 110 | 3 | N/Y |
| 145 | 91 | ' | 110 | 3 | N/Y |
| 146 | 92 | ' | 110 | 3 | N/Y |
| 147 | 93 | " | 110 | 3 | N/Y |
| 148 | 94 | " | 110 | 3 | N/Y |
| 149 | 95 | • | 110 | 3 | N/Y |
| 150 | 96 | – | 110 | 3 | N/Y |
| 151 | 97 | — | 110 | 3 | N/Y |
| 152 | 98 | ˜ | 110 | 3 | N/Y |
| 153 | 99 | ™ | 110 | 3 | N/Y |
| 154 | 9A | š | 110 | 3 | N/Y |
| 155 | 9B | › | 110 | 3 | N/Y |
| 156 | 9C | œ | 110 | 3 | N/Y |
| 157 | 9D | □ | 110 | 3 | N/Y |
| 158 | 9E | ž | 110 | 3 | N/Y |
| 159 | 9F | Ÿ | 110 | 3 | N/Y |
| 160 | A0 |  | 110 | 3 | N/Y |
| 161 | A1 | ¡ | 110 | 3 | N/Y |
| 162 | A2 | ¢ | 110 | 3 | N/Y |
| 163 | A3 | £ | 110 | 3 | N/Y |
| 164 | A4 | ¤ | 110 | 3 | N/Y |
| 165 | A5 | ¥ | 110 | 3 | N/Y |
| 166 | A6 | ¦ | 110 | 3 | N/Y |
| 167 | A7 | § | 110 | 3 | N/Y |
| 168 | A8 | ¨ | 110 | 3 | N/Y |
| 169 | A9 | © | 110 | 3 | N/Y |
| 170 | AA | ª | 110 | 3 | N/Y |
| 171 | AB | « | 110 | 3 | N/Y |
| 172 | AC | ¬ | 110 | 3 | N/Y |
| 173 | AD | - | 110 | 3 | N/Y |
| 174 | AE | ® | 110 | 3 | N/Y |
| 175 | AF | ¯ | 110 | 3 | N/Y |
| 176 | B0 | ° | 110 | 3 | N/Y |
| 177 | B1 | ± | 110 | 3 | N/Y |
| 178 | B2 | ² | 110 | 3 | N/Y |
| 179 | B3 | ³ | 110 | 3 | N/Y |
| 180 | B4 | ´ | 110 | 3 | N/Y |
| 181 | B5 | µ | 110 | 3 | N/Y |
| 182 | B6 | ¶ | 110 | 3 | N/Y |
| 183 | B7 | · | 110 | 3 | N/Y |
| 184 | B8 | ¸ | 110 | 3 | N/Y |
| 185 | B9 | ¹ | 110 | 3 | N/Y |
| 186 | BA | º | 110 | 3 | N/Y |
| 187 | BB | » | 110 | 3 | N/Y |
| 188 | BC | ¼ | 110 | 3 | N/Y |
| 189 | BD | ½ | 110 | 3 | N/Y |
| 190 | BE | ¾ | 110 | 3 | N/Y |
| 191 | BF | ¿ | 110 | 3 | N/Y |
| 192 | C0 | À | 110 | 3 | N/Y |
| 193 | C1 | Á | 110 | 3 | N/Y |
| 194 | C2 | Â | 110 | 3 | N/Y |
| 195 | C3 | Ã | 110 | 3 | N/Y |
| 196 | C4 | Ä | 110 | 3 | N/Y |
| 197 | C5 | Å | 110 | 3 | N/Y |
| 198 | C6 | Æ | 110 | 3 | N/Y |
| 199 | C7 | Ç | 110 | 3 | N/Y |
| 200 | C8 | È | 110 | 3 | N/Y |
| 201 | C9 | É | 110 | 3 | N/Y |
| 202 | CA | Ê | 110 | 3 | N/Y |
| 203 | CB | Ë | 110 | 3 | N/Y |
| 204 | CC | Ì | 110 | 3 | N/Y |
| 205 | CD | Í | 110 | 3 | N/Y |
| 206 | CE | Î | 110 | 3 | N/Y |
| 207 | CF | Ï | 110 | 3 | N/Y |
| 208 | D0 | Ð | 110 | 3 | N/Y |
| 209 | D1 | Ñ | 110 | 3 | N/Y |
| 210 | D2 | Ò | 110 | 3 | N/Y |
| 211 | D3 | Ó | 110 | 3 | N/Y |
| 212 | D4 | Ô | 110 | 3 | N/Y |
| 213 | D5 | Õ | 110 | 3 | N/Y |
| 214 | D6 | Ö | 110 | 3 | N/Y |
| 215 | D7 | × | 110 | 3 | N/Y |
| 216 | D8 | Ø | 110 | 3 | N/Y |
| 217 | D9 | Ù | 110 | 3 | N/Y |
| 218 | DA | Ú | 110 | 3 | N/Y |
| 219 | DB | Û | 110 | 3 | N/Y |
| 220 | DC | Ü | 110 | 3 | N/Y |
| 221 | DD | Ý | 110 | 3 | N/Y |
| 222 | DE | Þ | 110 | 3 | N/Y |
| 223 | DF | ß | 110 | 3 | N/Y |
| 224 | E0 | à | 110 | 3 | N/Y |
| 225 | E1 | á | 110 | 3 | N/Y |
| 226 | E2 | â | 110 | 3 | N/Y |
| 227 | E3 | ã | 110 | 3 | N/Y |
| 228 | E4 | ä | 110 | 3 | N/Y |
| 229 | E5 | å | 110 | 3 | N/Y |
| 230 | E6 | æ | 110 | 3 | N/Y |

TABLE 2-continued

| ASCII dec | ASCII hex | Character | Codeword | Length | Shifted |
|---|---|---|---|---|---|
| 231 | E7 | ç | 110 | 3 | N/Y |
| 232 | E8 | è | 110 | 3 | N/Y |
| 233 | E9 | é | 110 | 3 | N/Y |
| 234 | EA | ê | 110 | 3 | N/Y |
| 235 | EB | ë | 110 | 3 | N/Y |
| 236 | EC | ì | 110 | 3 | N/Y |
| 237 | ED | í | 110 | 3 | N/Y |
| 238 | EE | î | 110 | 3 | N/Y |
| 239 | EF | ï | 110 | 3 | N/Y |
| 240 | F0 | ð | 110 | 3 | N/Y |
| 241 | F1 | ñ | 110 | 3 | N/Y |
| 242 | F2 | ò | 110 | 3 | N/Y |
| 243 | F3 | ó | 110 | 3 | N/Y |
| 244 | F4 | ô | 110 | 3 | N/Y |
| 245 | F5 | õ | 110 | 3 | N/Y |
| 246 | F6 | ö | 110 | 3 | N/Y |
| 247 | F7 | ÷ | 110 | 3 | N/Y |
| 248 | F8 | ø | 110 | 3 | N/Y |
| 249 | F9 | ù | 110 | 3 | N/Y |
| 250 | FA | ú | 110 | 3 | N/Y |
| 251 | FB | û | 110 | 3 | N/Y |
| 252 | FC | ü | 110 | 3 | N/Y |
| 253 | FD | ý | 110 | 3 | N/Y |
| 254 | FE | þ | 110 | 3 | N/Y |
| 255 | FF | ÿ | 110 | 3 | N/Y |

Expansion

The compressed ASCII characters are converted to a string of bits. The first 3 bits are compared to existing codewords and if a match is found the associated characters are added to the output buffer. The first 3 bits are then removed. This process continues for all codeword lengths up to 8 bits and until the whole string has been analyzed. Padded 0s at the end of the string are ignored.

Table 3 shows the codeword to ASCII translation. In this table, 8 bits are shown for every codeword. For the sake of simplicity, use only left located significant bits. The start state is unshifted.

TABLE 3

| Compressed bits | | | Unshifted characters (default) | | | Shifted characters | | |
|---|---|---|---|---|---|---|---|---|
| Binary | Hex | Bits | Character | ASCII decimal | ASCII hex | Character | ASCII decimal | ASCII hex |
| 00000000 | 00 | 3 | E | 69 | 45 | 0 | 48 | 30 |
| 00000001 | 01 | 3 | E | 69 | 45 | 0 | 48 | 30 |
| 00000010 | 02 | 3 | E | 69 | 45 | 0 | 48 | 30 |
| 00000011 | 03 | 3 | E | 69 | 45 | 0 | 48 | 30 |
| 00000100 | 04 | 3 | E | 69 | 45 | 0 | 48 | 30 |
| 00000101 | 05 | 3 | E | 69 | 45 | 0 | 48 | 30 |
| 00000110 | 06 | 3 | E | 69 | 45 | 0 | 48 | 30 |
| 00000111 | 07 | 3 | E | 69 | 45 | 0 | 48 | 30 |
| 00001000 | 08 | 3 | E | 69 | 45 | 0 | 48 | 30 |
| 00001001 | 09 | 3 | E | 69 | 45 | 0 | 48 | 30 |
| 00001010 | 0A | 3 | E | 69 | 45 | 0 | 48 | 30 |
| 00001011 | 0B | 3 | E | 69 | 45 | 0 | 48 | 30 |
| 00001100 | 0C | 3 | E | 69 | 45 | 0 | 48 | 30 |
| 00001101 | 0D | 3 | E | 69 | 45 | 0 | 48 | 30 |
| 00001110 | 0E | 3 | E | 69 | 45 | 0 | 48 | 30 |
| 00001111 | 0F | 3 | E | 69 | 45 | 0 | 48 | 30 |
| 00010000 | 10 | 3 | E | 69 | 45 | 0 | 48 | 30 |
| 00010001 | 11 | 3 | E | 69 | 45 | 0 | 48 | 30 |
| 00010010 | 12 | 3 | E | 69 | 45 | 0 | 48 | 30 |
| 00010011 | 13 | 3 | E | 69 | 45 | 0 | 48 | 30 |
| 00010100 | 14 | 3 | E | 69 | 45 | 0 | 48 | 30 |
| 00010101 | 15 | 3 | E | 69 | 45 | 0 | 48 | 30 |
| 00010110 | 16 | 3 | E | 69 | 45 | 0 | 48 | 30 |
| 00010111 | 17 | 3 | E | 69 | 45 | 0 | 48 | 30 |
| 00011000 | 18 | 3 | E | 69 | 45 | 0 | 48 | 30 |
| 00011001 | 19 | 3 | E | 69 | 45 | 0 | 48 | 30 |
| 00011010 | 1A | 3 | E | 69 | 45 | 0 | 48 | 30 |
| 00011011 | 1B | 3 | E | 69 | 45 | 0 | 48 | 30 |
| 00011100 | 1C | 3 | E | 69 | 45 | 0 | 48 | 30 |
| 00011101 | 1D | 3 | E | 69 | 45 | 0 | 48 | 30 |
| 00011110 | 1E | 3 | E | 69 | 45 | 0 | 48 | 30 |
| 00011111 | 1F | 3 | E | 69 | 45 | 0 | 48 | 30 |
| 00100000 | 20 | 4 | S | 83 | 53 | 6 | 54 | 36 |
| 00100001 | 21 | 4 | S | 83 | 53 | 6 | 54 | 36 |
| 00100010 | 22 | 4 | S | 83 | 53 | 6 | 54 | 36 |
| 00100011 | 23 | 4 | S | 83 | 53 | 6 | 54 | 36 |
| 00100100 | 24 | 4 | S | 83 | 53 | 6 | 54 | 36 |
| 00100101 | 25 | 4 | S | 83 | 53 | 6 | 54 | 36 |
| 00100110 | 26 | 4 | S | 83 | 53 | 6 | 54 | 36 |
| 00100111 | 27 | 4 | S | 83 | 53 | 6 | 54 | 36 |
| 00101000 | 28 | 4 | S | 83 | 53 | 6 | 54 | 36 |
| 00101001 | 29 | 4 | S | 83 | 53 | 6 | 54 | 36 |

TABLE 3-continued

| | | | Unshifted characters (default) | | | Shifted characters | | |
|---|---|---|---|---|---|---|---|---|
| Compressed bits | | | | ASCII | ASCII | | ASCII | ASCII |
| Binary | Hex | Bits | Character | decimal | hex | Character | decimal | hex |
| 00101010 | 2A | 4 | S | 83 | 53 | 6 | 54 | 36 |
| 00101011 | 2B | 4 | S | 83 | 53 | 6 | 54 | 36 |
| 00101100 | 2C | 4 | S | 83 | 53 | 6 | 54 | 36 |
| 00101101 | 2D | 4 | S | 83 | 53 | 6 | 54 | 36 |
| 00101110 | 2E | 4 | S | 83 | 53 | 6 | 54 | 36 |
| 00101111 | 2F | 4 | S | 83 | 53 | 6 | 54 | 36 |
| 00110000 | 30 | 4 | Shift C set | NA | NA | Unshift | NA | NA |
| 00110001 | 31 | 4 | Shift C set | NA | NA | Unshift | NA | NA |
| 00110010 | 32 | 4 | Shift C set | NA | NA | Unshift | NA | NA |
| 00110011 | 33 | 4 | Shift C set | NA | NA | Unshift | NA | NA |
| 00110100 | 34 | 4 | Shift C set | NA | NA | Unshift | NA | NA |
| 00110101 | 35 | 4 | Shift C set | NA | NA | Unshift | NA | NA |
| 00110110 | 36 | 4 | Shift C set | NA | NA | Unshift | NA | NA |
| 00110111 | 37 | 4 | Shift C set | NA | NA | Unshift | NA | NA |
| 00111000 | 38 | 4 | Shift C set | NA | NA | Unshift | NA | NA |
| 00111001 | 39 | 4 | Shift C set | NA | NA | Unshift | NA | NA |
| 00111010 | 3A | 4 | Shift C set | NA | NA | Unshift | NA | NA |
| 00111011 | 3B | 4 | Shift C set | NA | NA | Unshift | NA | NA |
| 00111100 | 3C | 4 | Shift C set | NA | NA | Unshift | NA | NA |
| 00111101 | 3D | 4 | Shift C set | NA | NA | Unshift | NA | NA |
| 00111110 | 3E | 4 | Shift C set | NA | NA | Unshift | NA | NA |
| 00111111 | 3F | 4 | Shift C set | NA | NA | Unshift | NA | NA |
| 01000000 | 40 | 5 | C | 67 | 43 | $ | 36 | 24 |
| 01000001 | 41 | 5 | C | 67 | 43 | $ | 36 | 24 |
| 01000010 | 42 | 5 | C | 67 | 43 | $ | 36 | 24 |
| 01000011 | 43 | 5 | C | 67 | 43 | $ | 36 | 24 |
| 01000100 | 44 | 5 | C | 67 | 43 | $ | 36 | 24 |
| 01000101 | 45 | 5 | C | 67 | 43 | $ | 36 | 24 |
| 01000110 | 46 | 5 | C | 67 | 43 | $ | 36 | 24 |
| 01000111 | 47 | 5 | C | 67 | 43 | $ | 36 | 24 |
| 01001000 | 48 | 7 | ? | 63 | 3F | - | 45 | 2D |
| 01001001 | 49 | 7 | ? | 63 | 3F | - | 45 | 2D |
| 01001010 | 4A | 7 | V | 86 | 56 | = | 61 | 3D |
| 01001011 | 4B | 7 | V | 86 | 56 | = | 61 | 3D |
| 01001100 | 4C | 6 | P | 80 | 50 | ! | 33 | 21 |
| 01001101 | 4D | 6 | P | 80 | 50 | ! | 33 | 21 |
| 01001110 | 4E | 6 | P | 80 | 50 | ! | 33 | 21 |
| 01001111 | 4F | 6 | P | 80 | 50 | ! | 33 | 21 |
| 01010000 | 50 | 4 | N | 78 | 4E | 5 | 53 | 35 |
| 01010001 | 51 | 4 | N | 78 | 4E | 5 | 53 | 35 |
| 01010010 | 52 | 4 | N | 78 | 4E | 5 | 53 | 35 |
| 01010011 | 53 | 4 | N | 78 | 4E | 5 | 53 | 35 |
| 01010100 | 54 | 4 | N | 78 | 4E | 5 | 53 | 35 |
| 01010101 | 55 | 4 | N | 78 | 4E | 5 | 53 | 35 |
| 01010110 | 56 | 4 | N | 78 | 4E | 5 | 53 | 35 |
| 01010111 | 57 | 4 | N | 78 | 4E | 5 | 53 | 35 |
| 01011000 | 58 | 4 | N | 78 | 4E | 5 | 53 | 35 |
| 01011001 | 59 | 4 | N | 78 | 4E | 5 | 53 | 35 |
| 01011010 | 5A | 4 | N | 78 | 4E | 5 | 53 | 35 |
| 01011011 | 5B | 4 | N | 78 | 4E | 5 | S3 | 35 |
| 01011100 | 5C | 4 | N | 78 | 4E | 5 | 53 | 35 |
| 01011101 | 5D | 4 | N | 78 | 4E | 5 | 53 | 35 |
| 01011110 | 5E | 4 | N | 78 | 4E | 5 | 53 | 35 |
| 01011111 | 5F | 4 | N | 78 | 4E | 5 | 53 | 35 |
| 01100000 | 60 | 4 | I | 73 | 49 | 4 | 52 | 34 |
| 01100001 | 61 | 4 | I | 73 | 49 | 4 | 52 | 34 |
| 01100010 | 62 | 4 | I | 73 | 49 | 4 | 52 | 34 |
| 01100011 | 63 | 4 | I | 73 | 49 | 4 | 52 | 34 |
| 01100100 | 64 | 4 | I | 73 | 49 | 4 | 52 | 34 |
| 01100101 | 65 | 4 | I | 73 | 49 | 4 | 52 | 34 |
| 01100110 | 66 | 4 | I | 73 | 49 | 4 | 52 | 34 |
| 01100111 | 67 | 4 | I | 73 | 49 | 4 | 52 | 34 |
| 01101000 | 68 | 4 | I | 73 | 49 | 4 | 52 | 34 |
| 01101001 | 69 | 4 | I | 73 | 49 | 4 | 52 | 34 |
| 01101010 | 6A | 4 | I | 73 | 49 | 4 | 52 | 34 |
| 01101011 | 6B | 4 | I | 73 | 49 | 4 | 52 | 34 |
| 01101100 | 6C | 4 | I | 73 | 49 | 4 | 52 | 34 |
| 01101101 | 6D | 4 | I | 73 | 49 | 4 | 52 | 34 |
| 01101110 | 6E | 4 | I | 73 | 49 | 4 | 52 | 34 |
| 01101111 | 6F | 4 | I | 73 | 49 | 4 | 52 | 34 |
| 01110000 | 70 | 4 | O | 79 | 4F | 3 | 51 | 33 |
| 01110001 | 71 | 4 | O | 79 | 4F | 3 | 51 | 33 |
| 01110010 | 72 | 4 | O | 79 | 4F | 3 | 51 | 33 |

TABLE 3-continued

| Compressed bits | | | Unshifted characters (default) | | | Shifted characters | | |
|---|---|---|---|---|---|---|---|---|
| Binary | Hex | Bits | Character | ASCII decimal | ASCII hex | Character | ASCII decimal | ASCII hex |
| 01110011 | 73 | 4 | O | 79 | 4F | 3 | 51 | 33 |
| 01110100 | 74 | 4 | O | 79 | 4F | 3 | 51 | 33 |
| 01110101 | 75 | 4 | O | 79 | 4F | 3 | 51 | 33 |
| 01110110 | 76 | 4 | O | 79 | 4F | 3 | 51 | 33 |
| 01110111 | 77 | 4 | O | 79 | 4F | 3 | 51 | 33 |
| 01111000 | 78 | 4 | O | 79 | 4F | 3 | 51 | 33 |
| 01111001 | 79 | 4 | O | 79 | 4F | 3 | 51 | 33 |
| 01111010 | 7A | 4 | O | 79 | 4F | 3 | 51 | 33 |
| 01111011 | 7B | 4 | O | 79 | 4F | 3 | 51 | 33 |
| 01111100 | 7C | 4 | O | 79 | 4F | 3 | 51 | 33 |
| 01111101 | 7D | 4 | O | 79 | 4F | 3 | 51 | 33 |
| 01111110 | 7E | 4 | O | 79 | 4F | 3 | 51 | 33 |
| 01111111 | 7F | 4 | O | 79 | 4F | 3 | 51 | 33 |
| 10000000 | 80 | 6 | Y | 89 | 59 | > | 62 | 3E |
| 10000001 | 81 | 6 | Y | 89 | 59 | > | 62 | 3E |
| 10000010 | 82 | 6 | Y | 89 | 59 | > | 62 | 3E |
| 10000011 | 83 | 6 | Y | 89 | 59 | > | 62 | 3E |
| 10000100 | 84 | 6 | G | 71 | 47 | < | 60 | 3C |
| 10000101 | 85 | 6 | G | 71 | 47 | < | 60 | 3C |
| 10000110 | 86 | 6 | G | 71 | 47 | < | 60 | 3C |
| 10000111 | 87 | 6 | G | 71 | 47 | < | 60 | 3C |
| 10001000 | 88 | 5 | L | 76 | 4C | # | 35 | 23 |
| 10001001 | 89 | 5 | L | 76 | 4C | # | 35 | 23 |
| 10001010 | 8A | 5 | L | 76 | 4C | # | 35 | 23 |
| 10001011 | 8B | 5 | L | 76 | 4C | # | 35 | 23 |
| 10001100 | 8C | 5 | L | 76 | 4C | # | 35 | 23 |
| 10001101 | 8D | 5 | L | 76 | 4C | # | 35 | 23 |
| 10001110 | 8E | 5 | L | 76 | 4C | # | 35 | 23 |
| 10001111 | 8F | 5 | L | 76 | 4C | # | 35 | 23 |
| 10010000 | 90 | 4 | A | 65 | 41 | 2 | 50 | 32 |
| 10010001 | 91 | 4 | A | 65 | 41 | 2 | 50 | 32 |
| 10010010 | 92 | 4 | A | 65 | 41 | 2 | 50 | 32 |
| 10010011 | 93 | 4 | A | 65 | 41 | 2 | 50 | 32 |
| 10010100 | 94 | 4 | A | 65 | 41 | 2 | 50 | 32 |
| 10010101 | 95 | 4 | A | 65 | 41 | 2 | 50 | 32 |
| 10010110 | 96 | 4 | A | 65 | 41 | 2 | 50 | 32 |
| 10010111 | 97 | 4 | A | 65 | 41 | 2 | 50 | 32 |
| 10011000 | 98 | 4 | A | 65 | 41 | 2 | 50 | 32 |
| 10011001 | 99 | 4 | A | 65 | 41 | 2 | 50 | 32 |
| 10011010 | 9A | 4 | A | 65 | 41 | 2 | 50 | 32 |
| 10011011 | 9B | 4 | A | 65 | 41 | 2 | 50 | 32 |
| 10011100 | 9C | 4 | A | 65 | 41 | 2 | 50 | 32 |
| 10011101 | 9D | 4 | A | 65 | 41 | 2 | 50 | 32 |
| 10011110 | 9E | 4 | A | 65 | 41 | 2 | 50 | 32 |
| 10011111 | 9F | 4 | A | 65 | 41 | 2 | 50 | 32 |
| 10100000 | A0 | 5 | D | 68 | 44 | 9 | 57 | 39 |
| 10100001 | A1 | 5 | D | 68 | 44 | 9 | 57 | 39 |
| 10100010 | A2 | 5 | D | 68 | 44 | 9 | 57 | 39 |
| 10100011 | A3 | 5 | D | 68 | 44 | 9 | 57 | 39 |
| 10100100 | A4 | 5 | D | 68 | 44 | 9 | 57 | 39 |
| 10100101 | A5 | 5 | D | 68 | 44 | 9 | 57 | 39 |
| 10100110 | A6 | 5 | D | 68 | 44 | 9 | 57 | 39 |
| 10100111 | A7 | 5 | D | 68 | 44 | 9 | 57 | 39 |
| 10101000 | A8 | 8 | X | 88 | 58 | & | 38 | 26 |
| 10101001 | A9 | 8 | Q | 81 | 51 | @ | 64 | 40 |
| 10101010 | AA | 8 | ' | 39 | 27 | Control G | 7 | 07 |
| 10101011 | AB | 8 | Z | 90 | 5A | % | 37 | 25 |
| 10101100 | AC | 6 | F | 70 | 46 | : | 58 | 3A |
| 10101101 | AD | 6 | F | 70 | 46 | : | 58 | 3A |
| 10101110 | AE | 6 | F | 70 | 46 | : | 58 | 3A |
| 10101111 | AF | 6 | F | 70 | 46 | : | 58 | 3A |
| 10110000 | B0 | 4 | T | 84 | 54 | 1 | 49 | 31 |
| 10110001 | B1 | 4 | T | 84 | 54 | 1 | 49 | 31 |
| 10110010 | B2 | 4 | T | 84 | 54 | 1 | 49 | 31 |
| 10110011 | B3 | 4 | T | 84 | 54 | 1 | 49 | 31 |
| 10110100 | B4 | 4 | T | 84 | 54 | 1 | 49 | 31 |
| 10110101 | B5 | 4 | T | 84 | 54 | 1 | 49 | 31 |
| 10110110 | B6 | 4 | T | 84 | 54 | 1 | 49 | 31 |
| 10110111 | B7 | 4 | T | 84 | 54 | 1 | 49 | 31 |
| 10111000 | B8 | 4 | T | 84 | 54 | 1 | 49 | 31 |
| 10111001 | B9 | 4 | T | 84 | 54 | 1 | 49 | 31 |
| 10111010 | BA | 4 | T | 84 | 54 | 1 | 49 | 31 |
| 10111011 | BB | 4 | T | 84 | 54 | 1 | 49 | 31 |

TABLE 3-continued

| Compressed bits | | | Unshifted characters (default) | | | Shifted characters | | |
| --- | --- | --- | --- | --- | --- | --- | --- | --- |
| Binary | Hex | Bits | Character | ASCII decimal | ASCII hex | Character | ASCII decimal | ASCII hex |
| 10111100 | BC | 4 | T | 84 | 54 | 1 | 49 | 31 |
| 10111101 | BD | 4 | T | 84 | 54 | 1 | 49 | 31 |
| 10111110 | BE | 4 | T | 84 | 54 | 1 | 49 | 31 |
| 10111111 | BF | 4 | T | 84 | 54 | 1 | 49 | 31 |
| 11000000 | C0 | 3 | Space | 32 | 20 | Space | 32 | 20 |
| 11000001 | C1 | 3 | Space | 32 | 20 | Space | 32 | 20 |
| 11000010 | C2 | 3 | Space | 32 | 20 | Space | 32 | 20 |
| 11000011 | C3 | 3 | Space | 32 | 20 | Space | 32 | 20 |
| 11000100 | C4 | 3 | Space | 32 | 20 | Space | 32 | 20 |
| 11000101 | C5 | 3 | Space | 32 | 20 | Space | 32 | 20 |
| 11000110 | C6 | 3 | Space | 32 | 20 | Space | 32 | 20 |
| 11000111 | C7 | 3 | Space | 32 | 20 | Space | 32 | 20 |
| 11001000 | C8 | 3 | Space | 32 | 20 | Space | 32 | 20 |
| 11001001 | C9 | 3 | Space | 32 | 20 | Space | 32 | 20 |
| 11001010 | CA | 3 | Space | 32 | 20 | Space | 32 | 20 |
| 11001011 | CB | 3 | Space | 32 | 20 | Space | 32 | 20 |
| 11001100 | CC | 3 | Space | 32 | 20 | Space | 32 | 20 |
| 11001101 | CD | 3 | Space | 32 | 20 | Space | 32 | 20 |
| 11001110 | CE | 3 | Space | 32 | 20 | Space | 32 | 20 |
| 11001111 | CF | 3 | Space | 32 | 20 | Space | 32 | 20 |
| 11010000 | D0 | 3 | Space | 32 | 20 | Space | 32 | 20 |
| 11010001 | D1 | 3 | Space | 32 | 20 | Space | 32 | 20 |
| 11010010 | D2 | 3 | Space | 32 | 20 | Space | 32 | 20 |
| 11010011 | D3 | 3 | Space | 32 | 20 | Space | 32 | 20 |
| 11010100 | D4 | 3 | Space | 32 | 20 | Space | 32 | 20 |
| 11010101 | D5 | 3 | Space | 32 | 20 | Space | 32 | 20 |
| 11010110 | D6 | 3 | Space | 32 | 20 | Space | 32 | 20 |
| 11010111 | D7 | 3 | Space | 32 | 20 | Space | 32 | 20 |
| 11011000 | D8 | 3 | Space | 32 | 20 | Space | 32 | 20 |
| 11011001 | D9 | 3 | Space | 32 | 20 | Space | 32 | 20 |
| 11011010 | DA | 3 | Space | 32 | 20 | Space | 32 | 20 |
| 11911011 | DB | 3 | Space | 32 | 20 | Space | 32 | 20 |
| 11011100 | DC | 3 | Space | 32 | 20 | Space | 32 | 20 |
| 11011101 | DD | 3 | Space | 32 | 20 | Space | 32 | 20 |
| 11011110 | DE | 3 | Space | 32 | 20 | Space | 32 | 20 |
| 11011111 | DF | 3 | Space | 32 | 20 | Space | 32 | 20 |
| 11100000 | E0 | 6 | W | 87 | 57 | / | 47 | 2F |
| 11100001 | E1 | 6 | W | 87 | 57 | / | 47 | 2F |
| 11100010 | E2 | 6 | W | 87 | 57 | / | 47 | 2F |
| 11100011 | E3 | 6 | W | 87 | 57 | / | 47 | 2F |
| 11100100 | E4 | 6 | M | 77 | 4D | , | 44 | 2C |
| 11100101 | E5 | 6 | M | 77 | 4D | , | 44 | 2C |
| 11100110 | E6 | 6 | M | 77 | 4D | , | 44 | 2C |
| 11100111 | E7 | 6 | M | 77 | 4D | , | 44 | 2C |
| 11101000 | E8 | 8 | J | 74 | 4A | ) | 41 | 29 |
| 11101001 | E9 | 8 | K | 75 | 4B | ( | 40 | 28 |
| 11101010 | EA | 7 | B | 66 | 42 | + | 43 | 2B |
| 11101011 | EB | 7 | B | 66 | 42 | + | 43 | 2B |
| 11101100 | EC | 6 | U | 85 | 55 | . | 46 | 2E |
| 11101101 | ED | 6 | U | 85 | 55 | . | 46 | 2E |
| 11101110 | EE | 6 | U | 85 | 55 | . | 46 | 2E |
| 11101111 | EF | 6 | U | 85 | 55 | . | 46 | 2E |
| 11110000 | F0 | 5 | R | 82 | 52 | 8 | 56 | 38 |
| 11110001 | F1 | 5 | R | 82 | 52 | 8 | 56 | 38 |
| 11110010 | F2 | 5 | R | 82 | 52 | 8 | 56 | 38 |
| 11110011 | F3 | 5 | R | 82 | 52 | 8 | 56 | 38 |
| 11110100 | F4 | 5 | R | 82 | 52 | 8 | 56 | 38 |
| 11110101 | F5 | 5 | R | 82 | 52 | 8 | 56 | 38 |
| 11110110 | F6 | 5 | R | 82 | 52 | 8 | 56 | 38 |
| 11110111 | F7 | 5 | R | 82 | 52 | 8 | 56 | 38 |
| 11111000 | F8 | 5 | H | 72 | 48 | 7 | 55 | 37 |
| 11111001 | F9 | 5 | H | 72 | 48 | 7 | 55 | 37 |
| 11111010 | FA | 5 | H | 72 | 48 | 7 | 55 | 37 |

TABLE 3-continued

| Compressed bits | | | Unshifted characters (default) | | | Shifted characters | | |
|---|---|---|---|---|---|---|---|---|
| Binary | Hex | Bits | Character | ASCII decimal | ASCII hex | Character | ASCII decimal | ASCII hex |
| 11111011 | FB | 5 | H | 72 | 48 | 7 | 55 | 37 |
| 11111100 | FC | 5 | H | 72 | 48 | 7 | 55 | 37 |
| 11111101 | FD | 5 | H | 72 | 48 | 7 | 55 | 37 |
| 11111110 | FE | 5 | H | 72 | 48 | 7 | 55 | 37 |
| 11111111 | FF | 5 | H | 72 | 48 | 7 | 55 | 37 |

Encoding Example

Table 4 shows a detailed forward message example where a 21 character message is compressed to 12 bytes. The table also shows that a 18 character return message can be compressed to less than 11 bytes. The data gathering system of U.S. Pat. No. 5,991,279 includes an MT2000 RS232 interface which uses escape sequences for certain controls which are not shown in this example. These are described in the RS232 interface spec, incorporated by reference herein.

The message text string is separated into 21 individual characters and each character is encoded accordingly. The numeric characters are divided out into a category of shifted characters and the shift codeword is inserted prior to the codewords of those characters. There are 168 uncompressed bits and 6 uncompressed packets. When the sequence is compressed, there are 94 bits. The sequence is then padded with zeros to provide an integer amount of packets, in this case 4 with 12 compressed bytes. The codewords are converted to ASCII characters which are transmitted over the network.

TABLE 4

| Forward message example | Call John 613 2304848 | | | | | | | | | | |
|---|---|---|---|---|---|---|---|---|---|---|---|
| Codeword sequence | | | | | | | | | | | |
| 01000 1001 10001 10001 110 11101000 0111 11111 0101 110 0011 0010 1011 0111 110 1001 0111 000 0110 11110 0110 11110 | | | | | | | | | | | |
| # characters | 21 | | | | | | | | | | |
| Uncompressed bits | 168 | | | | | | | | | | |
| Uncompressed packets | 6 | | | | | | | | | | |
| Compressed bits | 94 | | | | | | | | | | |
| Compressed bits/character | 4.5 | | | | | | | | | | |
| Padded bits | 96 | | | | | | | | | | |
| Compressed bytes | 12 | | | | | | | | | | |
| Compressed packets | 4 | | | | | | | | | | |
| Compressed/uncompressed packets | 0.67 | | | | | | | | | | |
| Bit sequence | | | | | | | | | | | |
| 010001001100011000111011101000011111110101110001100101011011111101001011100001101111001101111000 | | | | | | | | | | | |
| Byte sequence | | | | | | | | | | | |
| 01000100 | 11000110 | 00111011 | 10100001 | 11111110 | 10111000 | 11001010 | 11011111 | 01001011 | 10000110 | 11110011 | 01111000 |
| Decimal | | | | | | | | | | | |
| 68 | 198 | 59 | 161 | 254 | 184 | 202 | 223 | 75 | 134 | 243 | 120 |
| Over the air message | | | | | | | | | | | |
| D | Æ | ; | ¡ | þ | , | Ê | ß | K | † | ó | x |

| Return message example | LOSING ENGINE OIL |
|---|---|
| # characters | 18 |
| Compressed bits | 74 |
| Max bits in return message | 88 |
| Compressed bits/character | 4.11 |

Figure 3:
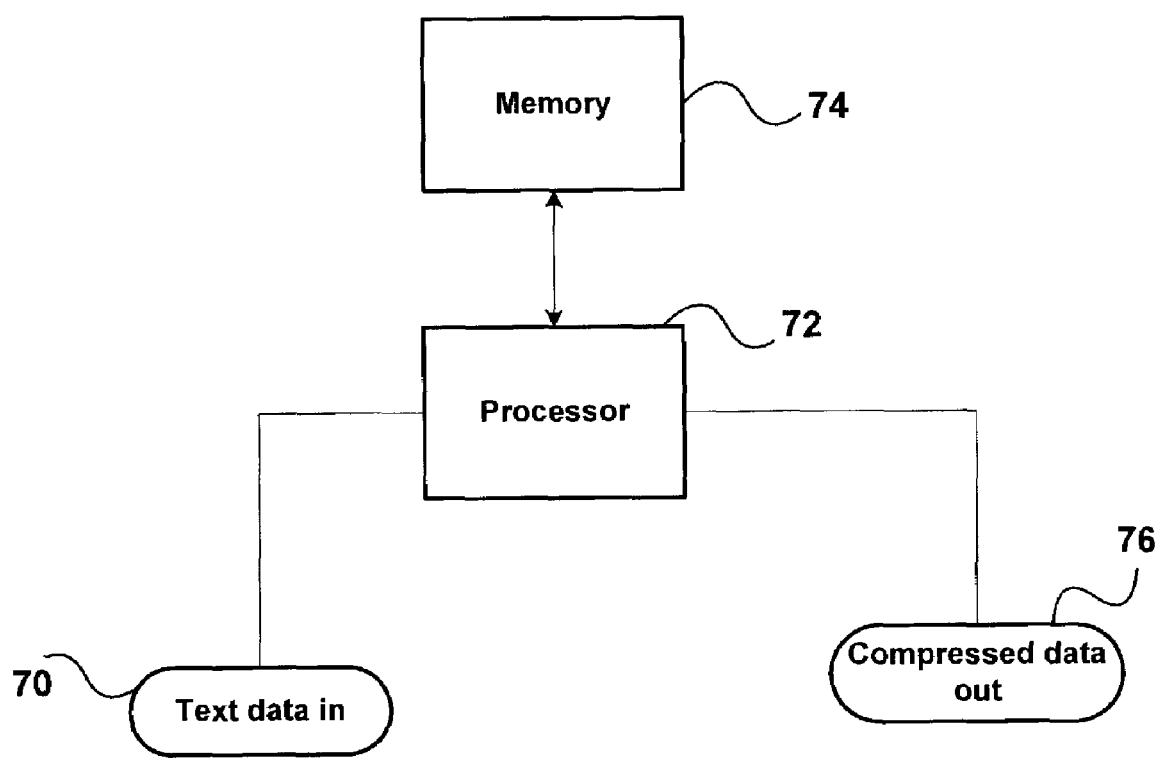
FIG. 3 is a block diagram of a system for implementing the encoding scheme of the present invention.

FIG. 3 illustrates a simple system for implementing the invention. Input textual data is received in input device 70 and output in output device 76 as a stream of ASCII characters. The processing takes place in processor 72 under the control of instructions stored in memory 74.

Thus, it can be seen that the text encoding method of the present invention requires less average codeword bits per character than the conventional Huffman method. The invention can conveniently implemented in a microprocessor to perform the text compression and expansion as described above.

Numerous modifications may be made without departing from the spirit and scope of the invention as defined in the appended claims.

| Unshifted character | | | | | Shifted character | | |
|---|---|---|---|---|---|---|---|
| ASCII dec | ASCII hex | Character | Codeword | # bits | ASCII dec | ASCII hex | Character |
| 69 | 45 | E | 000 | 3 | 48 | 30 | 0 |
| 32 | 20 | Space | 110 | 3 | 32 | 20 | Space |
| 65 | 41 | A | 1001 | 4 | 50 | 32 | 2 |
| 73 | 49 | I | 0110 | 4 | 52 | 34 | 4 |
| 78 | 4E | N | 0101 | 4 | 53 | 35 | 5 |
| 79 | 4F | O | 0111 | 4 | 51 | 33 | 3 |
| 83 | 53 | S | 0010 | 4 | 54 | 36 | 6 |
| 84 | 54 | T | 1011 | 4 | 49 | 31 | 1 |
| NA | NA | Shift | 0011 | 4 | NA | NA | Un-shifted |
| 67 | 43 | C | 01000 | 5 | 36 | 24 | $ |
| 68 | 44 | D | 10100 | 5 | 57 | 39 | 9 |
| 72 | 48 | H | 11111 | 5 | 55 | 37 | 7 |
| 76 | 4C | L | 10001 | 5 | 35 | 23 | # |
| 82 | 52 | R | 11110 | 5 | 56 | 38 | 8 |
| 70 | 46 | F | 101011 | 6 | 58 | 3A | : |
| 71 | 47 | G | 100001 | 6 | 60 | 3C | < |
| 77 | 4D | M | 111001 | 6 | 44 | 2C | , |
| 80 | 50 | P | 010011 | 6 | 33 | 21 | ! |
| 85 | 55 | U | 111011 | 6 | 46 | 2E | . |
| 87 | 57 | W | 111000 | 6 | 47 | 2F | / |
| 89 | 59 | Y | 100000 | 6 | 62 | 3E | > |
| 66 | 42 | B | 1110101 | 7 | 43 | 2B | + |
| 86 | 56 | V | 0100101 | 7 | 61 | 3D | = |
| 63 | 3F | ? | 0100100 | 7 | 45 | 2D | - |
| 74 | 4A | J | 11101000 | 8 | 41 | 29 | ) |
| 75 | 4B | K | 11101001 | 8 | 40 | 28 | ( |
| 81 | 51 | Q | 10101001 | 8 | 64 | 40 | @ |
| 88 | 58 | X | 10101000 | 8 | 38 | 26 | & |
| 90 | 5A | Z | 10101011 | 8 | 37 | 25 | % |
| 39 | 27 | ' | 10101010 | 8 | 7 | 07 | Control G. |

What is claimed is:

1. A method of transmitting information represented by characters of a defined character set over a communications channel, comprising the steps of:
    dividing said character set into subsets;
    encoding the characters in each subset with codewords of varying length dependent on the probability of occurrence of the encoded character, said subsets employing overlapping codewords, and each codeword within each said subset comprising a unique sequence of bits; and
    transmitting a unique indicator to identify a said subset to which transmitted characters belong.

2. The method of claim 1, wherein said unique indicator is a shift character indicating that subsequently transmitted characters are drawn from a different subset.

3. The method of claim 2, wherein one of said subsets is a default subset, and said unique indicator is only transmitted prior to initial transmission of a character from a said subset different from the default.

4. The method of claim 2, wherein the unique indicator is a high probability codeword.

5. The method of claim 4, wherein said high probability codeword has four bits.

6. The method of claim 1, wherein each codeword is limited to eight bits.

7. The method of claim 6, further comprising the step of padding the sequence of bits with zeros to ensure the sequence contains an integer number of bytes.

8. The method of claim 5, further comprising the step of converting the sequence of bits to ASCII characters for transmission over the communication channel.

9. The method as claimed in claim 1, wherein the communications channel is a satellite forward link.

10. The method as claimed in claim 1, wherein said characters are represented by the following sequences of bits:

11. A method of compressing textual data defined by characters forming part of a character set, wherein the characters are encoded by binary codewords of variable length, comprising the steps of:
    dividing said character set into subsets;
    encoding the characters in each subset with codewords of varying length dependent on the probability of occurrence of the encoded character, said subsets employing overlapping codewords, and each codeword within each said subset comprising a unique sequence of bits; and
    inserting a unique indicator in the compressed data to identify the subset to which said encoded characters belong.

12. The method of claim 11, wherein said unique indicator is a shift character indicating that subsequently encoded characters are drawn from a different subset.

13. The method of claim 12, wherein one of said subsets is a default subset, and said unique indicator is only inserted prior to a string of one or more characters from a said subset different from the default.

14. The method of claim 12, wherein the unique indicator is a high probability codeword.

15. The method of claim 14, wherein said high probability codeword has four bits.

16. The method of claim 11, wherein each codeword is limited to eight bits.

17. The method of claim 16, further comprising the step of padding the sequence of bits with zeros to ensure the sequence contains an integer number of bytes.

18. The method of claim 16, further comprising the step of converting the sequence of bits to ASCII characters for transmission over the communication channel.

19. The method of claim 11, wherein said characters are represented by the following sequences of bits:

probability of occurrence of the encoded character, said subsets employing overlapping codewords, each codeword within each said subset comprising a unique sequence of bits, and inserting a unique indicator in the compressed data to identify the subset to which said encoded characters belong.

21. The apparatus of claim 20, wherein said unique indicator is a shift character indicating that subsequently encoded characters are drawn from a different subset.

22. The apparatus of claim 21, wherein one of said subsets is a default subset, and said unique indicator is only inserted prior to a string of one or more characters from a said subset different from the default.

| Unshifted character | | | | | Shifted character | | |
|---|---|---|---|---|---|---|---|
| ASCII dec | ASCII hex | Character | Codeword | # bits | ASCII dec | ASCII hex | Character |
| 69 | 45 | E | 000 | 3 | 48 | 30 | 0 |
| 32 | 20 | Space | 110 | 3 | 32 | 20 | Space |
| 65 | 41 | A | 1001 | 4 | 50 | 32 | 2 |
| 73 | 49 | I | 0110 | 4 | 52 | 34 | 4 |
| 78 | 4E | N | 0101 | 4 | 53 | 35 | 5 |
| 79 | 4F | O | 0111 | 4 | 51 | 33 | 3 |
| 83 | 53 | S | 0010 | 4 | 54 | 36 | 6 |
| 84 | 54 | T | 1011 | 4 | 49 | 31 | 1 |
| NA | NA | Shift | 0011 | 4 | NA | NA | Un-shifted |
| 67 | 43 | C | 01000 | 5 | 36 | 24 | $ |
| 68 | 44 | D | 10100 | 5 | 57 | 39 | 9 |
| 72 | 48 | H | 11111 | 5 | 55 | 37 | 7 |
| 76 | 4C | L | 10001 | 5 | 35 | 23 | # |
| 82 | 52 | R | 11110 | 5 | 56 | 38 | 8 |
| 70 | 46 | F | 101011 | 6 | 58 | 3A | : |
| 71 | 47 | G | 100001 | 6 | 60 | 3C | < |
| 77 | 4D | M | 111001 | 6 | 44 | 2C | , |
| 80 | 50 | P | 010011 | 6 | 33 | 21 | ! |
| 85 | 55 | U | 111011 | 6 | 46 | 2E | . |
| 87 | 57 | W | 111000 | 6 | 47 | 2F | / |
| 89 | 59 | Y | 100000 | 6 | 62 | 3E | > |
| 66 | 42 | B | 1110101 | 7 | 43 | 2B | + |
| 86 | 56 | V | 0100101 | 7 | 61 | 3D | = |
| 63 | 3F | ? | 0100100 | 7 | 45 | 2D | - |
| 74 | 4A | J | 11101000 | 8 | 41 | 29 | ) |
| 75 | 4B | K | 11101001 | 8 | 40 | 28 | ( |
| 81 | 51 | Q | 10101001 | 8 | 64 | 40 | @ |
| 88 | 58 | X | 10101000 | 8 | 38 | 26 | & |
| 90 | 5A | Z | 10101011 | 8 | 37 | 25 | % |
| 39 | 27 | ' | 10101010 | 8 | 7 | 07 | Control G. |

20. An apparatus for compressing textual data defined by characters forming part of a character set, wherein the characters are encoded by binary codewords of variable length, comprising:

an input device for receiving said characters;

an output device for outputting compressed data; and a processor for encoding the characters in each subset with codewords of varying length dependent on the

23. The apparatus of claim 22, wherein said processor pads the sequence of bits with zeros to ensure the sequence contains an integer number of bytes.

24. The apparatus of claim 22, wherein said processor converts the sequence of bits to ASCII characters for transmission over the communication channel.

25. The apparatus of claim 20, wherein said characters are represented by the following sequences of bits stored in memory:

| Unshifted character | | | | | Shifted character | | |
|---|---|---|---|---|---|---|---|
| ASCII dec | ASCII hex | Character | Codeword | # bits | ASCII dec | ASCII hex | Character |
| 69 | 45 | E | 000 | 3 | 48 | 30 | 0 |
| 32 | 20 | Space | 110 | 3 | 32 | 20 | Space |
| 65 | 41 | A | 1001 | 4 | 50 | 32 | 2 |
| 73 | 49 | I | 0110 | 4 | 52 | 34 | 4 |
| 78 | 4E | N | 0101 | 4 | 53 | 35 | 5 |
| 79 | 4F | O | 0111 | 4 | 51 | 33 | 3 |
| 83 | 53 | S | 0010 | 4 | 54 | 36 | 6 |
| 84 | 54 | T | 1011 | 4 | 49 | 31 | 1 |
| NA | NA | Shift | 0011 | 4 | NA | NA | Un-shifted |
| 67 | 43 | C | 01000 | 5 | 36 | 24 | $ |
| 68 | 44 | D | 10100 | 5 | 57 | 39 | 9 |
| 72 | 48 | H | 11111 | 5 | 55 | 37 | 7 |
| 76 | 4C | L | 10001 | 5 | 35 | 23 | # |
| 82 | 52 | R | 11110 | 5 | 56 | 38 | 8 |
| 70 | 46 | F | 101011 | 6 | 58 | 3A | : |
| 71 | 47 | G | 100001 | 6 | 60 | 3C | < |
| 77 | 4D | M | 111001 | 6 | 44 | 2C | , |
| 80 | 50 | P | 010011 | 6 | 33 | 21 | ! |
| 85 | 55 | U | 111011 | 6 | 46 | 2E | . |
| 87 | 57 | W | 111000 | 6 | 47 | 2F | / |
| 89 | 59 | Y | 100000 | 6 | 62 | 3E | > |
| 66 | 42 | B | 1110101 | 7 | 43 | 2B | + |
| 86 | 56 | V | 0100101 | 7 | 61 | 3D | = |
| 63 | 3F | ? | 0100100 | 7 | 45 | 2D | − |
| 74 | 4A | J | 11101000 | 8 | 41 | 29 | ) |
| 75 | 4B | K | 11101001 | 8 | 40 | 28 | ( |
| 81 | 51 | Q | 10101001 | 8 | 64 | 40 | @ |
| 88 | 58 | X | 10101000 | 8 | 38 | 26 | & |
| 90 | 5A | Z | 10101011 | 8 | 37 | 25 | % |
| 39 | 27 | ' | 10101010 | 8 | 7 | 07 | Control G. |

\* \* \* \* \*